United States Patent [19]

Yoo

[11] Patent Number: 5,715,209
[45] Date of Patent: Feb. 3, 1998

[54] INTEGRATED CIRCUIT MEMORY DEVICES INCLUDING A DUAL TRANSISTOR COLUMN SELECTION SWITCH AND RELATED METHODS

[75] Inventor: Jei-Hwan Yoo, Suwon, Rep. of Korea

[73] Assignee: Samsung Electronics Co., Ltd., Suwon, Rep. of Korea

[21] Appl. No.: 644,129

[22] Filed: May 10, 1996

[30] Foreign Application Priority Data

May 12, 1995 [KR] Rep. of Korea ............. 95-11749

[51] Int. Cl.$^6$ ............................................. G11C 8/00
[52] U.S. Cl. ............................ 365/230.03; 365/189.03
[58] Field of Search ......................... 365/230.03, 189.03

[56] References Cited

U.S. PATENT DOCUMENTS

| | | | |
|---|---|---|---|
| 5,483,497 | 1/1996 | Mochizuki et al. | 365/230.03 |
| 5,499,215 | 3/1996 | Hatta | 365/230.03 |
| 5,535,172 | 7/1996 | Reddy et al. | 365/230.03 |
| 5,566,371 | 10/1996 | Ogawa | 365/230.03 |

Primary Examiner—David C. Nelms
Assistant Examiner—Michael T. Tran
Attorney, Agent, or Firm—Myers, Bigel, Sibley & Sajovec, L.L.P.

[57] ABSTRACT

An integrated circuit memory device includes a plurality of memory units arranged in an array of columns and banks. Each of the memory units includes a memory cell, and a bit line coupled to the memory cell wherein the bit line receives a bit of information from the memory cell. Each of a plurality of global column selection lines extends along a respective column of the memory units through each of the banks. A column decoder generates global column selection signals on the plurality of global column selection lines. Each of a plurality of input/output lines extends along a respective bank of the memory units. In addition, each of a plurality of memory unit selection circuits connects a respective bit line of a respective memory unit to a respective input/output line in response to a global column selection signal on the respective global column selection line and a bank selection column address signal. Accordingly, only one bit line from the plurality of memory units is connected to a respective one of the input/output lines at a time.

8 Claims, 2 Drawing Sheets

INTEGRATED CIRCUIT MEMORY DEVICES INCLUDING A DUAL TRANSISTOR COLUMN SELECTION SWITCH AND RELATED METHODS

FIELD OF THE INVENTION

The present invention relates to integrated circuit devices, and more particularly to integrated circuit memory devices.

BACKGROUND OF THE INVENTION

To provide increased density, capacity, and speed, integrated circuit semiconductor memory devices have been synchronized with system clocks and divided into a plurality of banks of memory cells. In particular, the system clock can be provided external to the memory device and used in the execution of operations internal to the memory device. The plurality of banks of memory cells, which may be referred to as a multi-bank design, allows the execution of individual data access operations for each bank. Accordingly, the latency resulting from strobe signals may be reduced.

In particular, a memory device provided by Hyundai Inc. is disclosed in ISSCC published on February, 1995. In this device, each bank of memory cells has independent row and column decoders and a data path. Global input/output lines are provided to each bank of memory cells and are coupled with main input/output lines. The global input/output lines are coupled with the sub input/output lines within each bank. A column select line structure within a single bank of memory cells of the above-mentioned memory device is shown in FIG. 1.

As shown in FIG. 1, each of the column select lines, CSL0 to CSLn, controls a pair of column select transistors CST1 and CST2 which connect a pair of bit lines BL and BLB with a pair of sub input/output lines SIO and SIOB. Each of the column select lines is used in common with a plurality of memory blocks MB0 to MBn. A precharge circuit (or a load circuit) PRT is connected with the sub input/output line pairs SIO and SIOB, and uses a relatively low level of power supply voltage to implement a sensing operation for a relatively small voltage. For example, an internal power supply voltage of 1.5V in a 256 Mb dynamic random access memory may be used. Accordingly, a predetermined level of precharge voltage may be supplied to each pair of sub input/output lines SiO and SIOB.

If a single word line within the memory block MB0 is selected, a corresponding bit line sense amplifier is activated, and a column select line CSL0 is activated. One data bit is then amplified by the sense amplifier SA and transmitted to the sub input/output lines SIO0 and SIOOB by way of the column select transistor pair CST1 and CST2. Because the current bit line pair and sub input/output line pair are respectively precharged to (½)Vcc within the other memory blocks, a potential variation on the sub input/output lines does not occur even though they are coupled through the column select transistor pair CST1 and CST2 which are turned on.

Because unselected bit lines and sub input/output lines are coupled with each other through a selected column select line, however, a voltage supplied from the precharge circuit PRT may allow an undesired current to flow to the sense amplifier SA connected to the unselected bit lines from the sub input/output lines. This current may cause unnecessary power consumption for the memory device.

When the word lines and sense amplifiers within two or more memory blocks among the memory blocks connected to a single column select line CSL are activated, all of the corresponding sub input/output lines and bit lines may be connected and data in unselected memory blocks may be transmitted to the sub input/output lines. In this event, the sub input/output lines may be precharged for the following data transmission before a column select signal state on the column select line CSL is charged.

Furthermore, since each memory block has an individual column decoder and data path, the size of the chip may increase when a multi-bank design is implemented. In addition, since one column select line output from the column decoder is connected to the plurality of memory blocks, a precharge operation for the sub input/output lines may be needed before the column select signal state can be changed, thereby increasing the current consumed. The precharge operation may be executed during pulse periods of at least 3-4 ns. In an integrated circuit memory device, however, having 256 Mb or more capacity in which numerous input/output lines are provided, such a precharge operation may be difficult to accurately adjust. The precharge operation may also act as a limitation for the frequency of operation in a memory device which is synchronized with an external system clock.

SUMMARY OF THE INVENTION

It is therefore an object of the present invention to provide an improved integrated circuit memory device.

It is another object of the present invention to provide an integrated circuit memory device having a reduced chip size.

It is still another object of the present invention to provide an integrated circuit memory device which may use simplified precharge operations.

It is yet another object of the present invention to provide an integrated circuit memory device having reduced current requirements.

It is still another object of the present invention to provide improved methods of fabricating integrated circuit memory devices.

These and other objects according to the present invention are provided by an integrated circuit memory device including a plurality of memory units arranged in an array of columns and banks. Each of the memory units includes at least one memory cell and a bit line coupled to the at least one memory cell wherein the bit line receives a bit of information from the at least one memory cell. Each of a plurality of global column selection lines extends along a respective column of the memory units through each of the banks. A column decoder generates global column selection signals on the global column selection lines, and each of a plurality of input/output lines extends along a respective bank of the memory units.

In addition, a plurality of memory unit selection circuits are provided, each of which connects a respective bit line of a respective memory unit to a respective input/output line responsive to a respective global column selection signal on the respective global column selection line and a bank select column address signal. Accordingly, only one bit line from the plurality of memory units is connected to a respective one of the input/output lines at a time. This arrangement may reduce current consumption during column select operations and may also reduce precharge operations.

Each of the memory selection circuits may also include a column selection transistor which connects the respective bit line to the respective input/output line responsive to the respective global column selection signal and the bank select column address signal. In addition, the memory selection circuits may further include first and second bank selection transistors. The first bank selection transistor electrically connects a gate of the column selection transistor to the respective global column selection line responsive to the bank select column address signal. The second bank selection transistor electrically connects the gate of the column selection transistor to a predetermined disable signal responsive to a logical inverse of the bank select column address signal.

According to another aspect of the present invention, a method is provided for selecting a memory unit of an integrated circuit memory device. In particular, the integrated circuit memory device includes a plurality of memory units arranged in an array of columns and banks, and a plurality of input/output lines each of which extends along a respective bank of the memory units. Each of the memory units includes at least one memory cell, a bit line coupled to the at least one memory cell, and a column selection transistor connected between the bit line and the respective input/output line.

The method includes the steps of generating a global column selection signal for each column of the memory units, and generating a bank select column address signal for each bank of the memory units. A bit line of a respective memory unit is connected to the respective input/output line through the column selection transistor responsive to a respective global column selection signal and a respective bank select column address signal. Accordingly, only one bit line from the plurality of memory units is connected to a respective one of the input/output lines at a time.

The present invention thus provides an integrated circuit memory device which allows high speed operation and relatively small chip size. In addition, the precharging of data lines can be reduced, as can the current consumption during column select line operations.

DETAILED DESCRIPTION

The present invention will now be described more fully hereinafter with reference to the accompanying drawings, in which a preferred embodiment of the invention is shown. This invention may, however, be embodied in many different forms and should not be construed as limited to the embodiments set forth herein; rather, this embodiment is provided so that this disclosure will be thorough and complete, and will fully convey the scope of the invention to those skilled in the art. Like numbers refer to like embodiments throughout.

Figure 2:
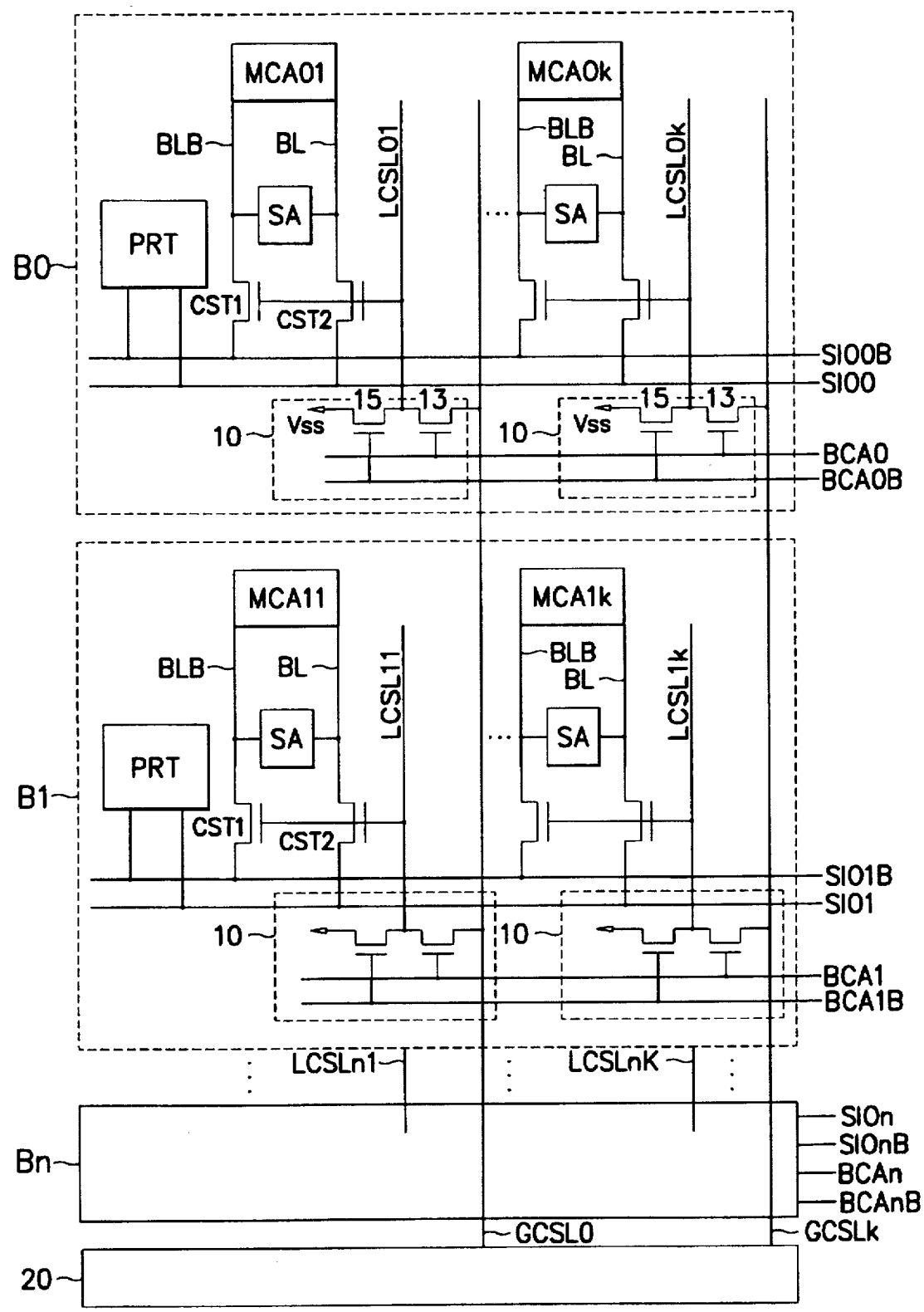
FIG. 2 is a circuit diagram illustrating a column select line stature according to the present invention.

A circuit diagram illustrating a column select line structure according to the present invention is shown in FIG. 2. A reference symbol "B", as used for example to reference the bank select column address signal "BCAOB" or a bit line "BLB", indicates a logical inverse signal for a corresponding signal or a complementary line for a corresponding line.

The memory array within the semiconductor memory device of the present invention is divided into a plurality of banks B0 through Bn (where n is an integer). A column decoder 20 is shared through all banks B0 to Bn, and not individually provided to each bank. A predetermined number k of global column select lines GCSL0 through GCSLk extend from the column decoder 20 in the direction of bit lines through each of the banks. The same number k of memory cells MCAnk are included in each bank, and each memory cell is coupled to a pair of bit lines BL and BLB. Each of the sense amplifiers SA is connected with the pair of bit lines, and each of a plurality of column select transistor pairs CST1 and CST2 are coupled between the bit line pair BL and BLB and the corresponding sub input/output line pairs SIOn and SIOnB. Each of the banks includes a pair of sub input/output lines which are connected to a precharge circuit (or load circuit) PRT for a low voltage sensing operation. Each of the pairs of sub input/output lines is connected in common to a pair of global input/output lines.

The pair of column select transistors CST1 and CST2 connect the corresponding pair of bit lines BL and BLB with the pair of sub input/output lines and have their respective gates connected to local column select lines LCSLnk. A local column select line is provided for each memory cell, and can be arranged to extend in the bit line direction within each bank. Each of a plurality of column select switches 10 is controlled by bank select column address signals BCAn and BCAnB, and connects one global column select line GCSLk and one local column select line LCSLnk.

Each column select switch 10 includes an NMOS transistor 13 which has its channel connected between the respective global column select line and the local column select line, and its gate connected to the bank select column address signal BCAn. A second NMOS transistor 15 has its channel connected between the local column select line and a ground voltage, and its gate is connected to the bank select column address signal BCAnB. One global column select line can thus be connected to each of the local column select lines associated with the memory cells in a column through the respective column select switches 10. The bank select column address signals are activated during every column access cycle.

Data from the memory cell MCA01 can be transmitted to the data lines SIO0 and SIO0B as follows. The word line and sense amplifier SA are activated in the memory cell MCA01 of the bank B0 and data is transmitted to the bit line pair BL and BLB. The global column select line GCSL0 is activated from among the global column select lines GCSL0 to GCSLk. In other words, the column select signal applied to the global column select line GCSL0 goes to a logic "high" level. The bank select column address signals BCA0 and BCA0B are activated so that the signal BCA0 goes to a logic "high" level and the signal BCA0B goes to a logic "low" level. The high level of the column select signal applied to the global column select line GCSL0 is transmitted to the local column select line LCSL01 by way of the NMOS transistor 13 which is turned on by the "high" level of the bank select column address signal BCA0.

At the same time, the NMOS transistor 15, which is connected to the ground voltage Vss, is turned off by the "low" level of the bank select column address signal BCA0B. Because the "high" level of the column select signal is applied to the gates of the column select transistors CST1 and CST2, the bit line pair BL and BLB are connected to the sub input/output line pair SIO0 and SIO0B via the column select transistors CST1 and CST2 which are turned on. The data read out from the memory cell MCA01 of the bank B0 is output to the exterior of the chip through the sub input/output line SIO0 and the global input/output line.

Figure 1:
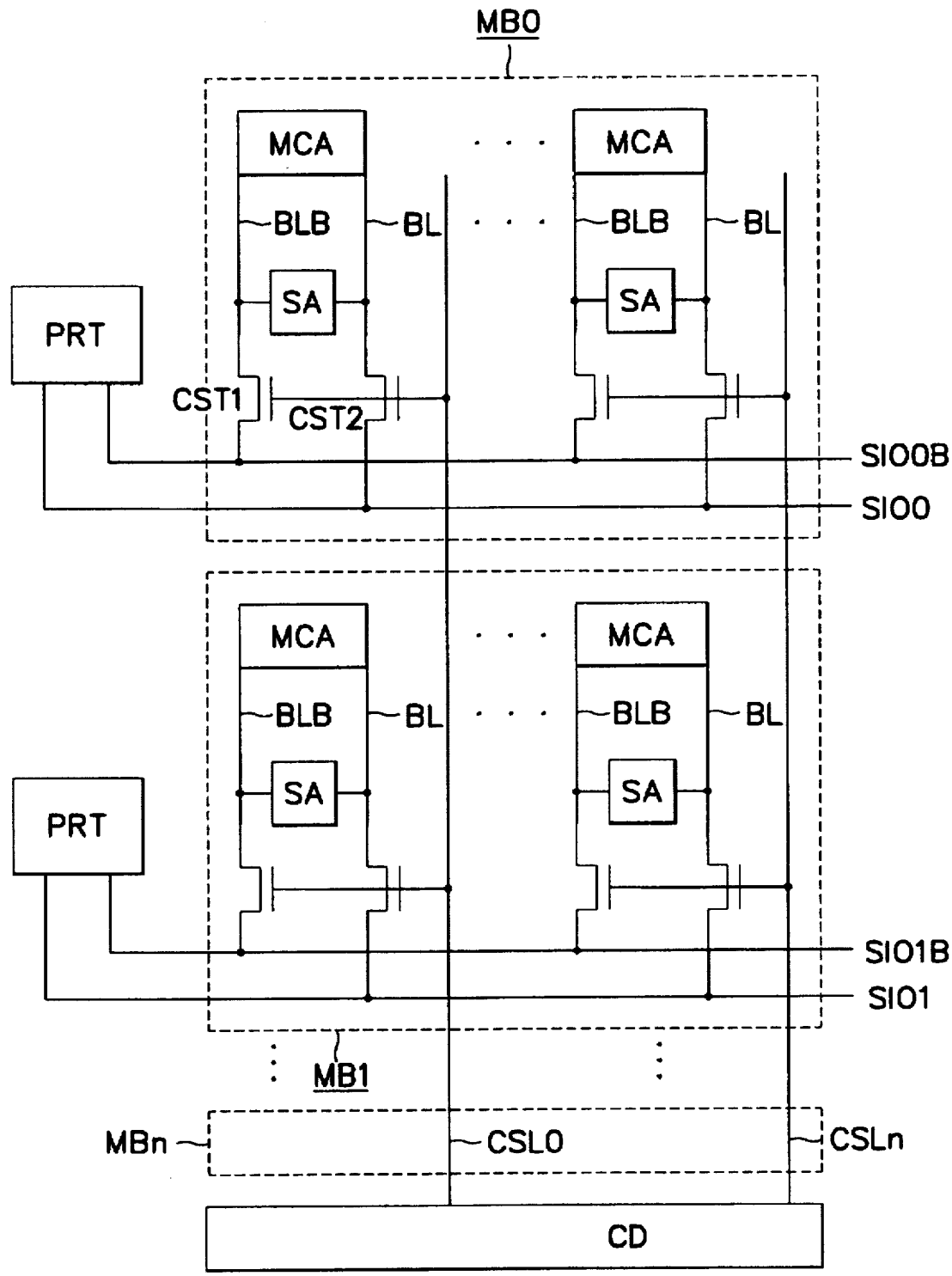
FIG. 1 is a circuit diagram illustrating a column select line structure according to the prior art.

In contrast to the memory device of FIG. 1, the bank select column address signals are activated in response to the activation of the global column select line during one column access cycle. This operation makes it unnecessary to connect one or more bit line and sub input/output lines to each other, thereby reducing unnecessary current and precharge operations. For example, even though the word lines and sense amplifier for the memory cell MCA01 of the bank B0 and those of the memory cell MCA11 of the bank B1 are simultaneously activated, only the local column selection line LCL01 is connected to the global column select line GCSL0 while the local column selection lines LCSL11 to LCSLnl remain unconnected to the global column select line GCSL0. This is because only the bank select column address signal BCA0 goes to the logic "high" level and the remaining bank select column address signals BCA1 to BCAn go to the logic "low" level. (At the same time, the bank select column address signal BCA0B goes to the logic "low" level while the bank select column address signals BCA1B to BCAnB go to the logic "high" level.)

As a result, the rest of the sub input/output line pairs SIO1 and SIO1B to SIOn and SIOnB (except the sub input/output line pair SIO0 and SIO0B) are not connected to the corresponding bit line pair. In the unselected banks, the column select switches 10 provide a ground voltage to the corresponding local column select lines. In particular, the NMOS transistor 15 is turned on connecting the local column select line to ground voltage, and the NMOS transistor 13 is turned off, thereby disconnecting the local column select line from the global column select line.

Because data is not transmitted to the sub input/output lines which are not associated with the bank select column address signal activated in conjunction with the global column select line, a precharge operation for preparation of the next column access cycle can be eliminated. In addition, the current flowing to the sense amplifier of bit lines from the precharge circuit PRT is reduced because the sub input/output lines are not unnecessarily connected to the bit lines. Furthermore, the chip size of an integrated circuit memory device having a multi-bank structure can be reduced because a column decoder controls the column access operation for all of the banks.

In the drawings and specification, there have been disclosed typical preferred embodiments of the invention, and although specific terms are employed, they are used in a generic and descriptive sense only and not for purposes of limitation, the scope of the invention being set forth in the following claims.

I claim:

1. An integrated circuit memory device comprising:
    a plurality of memory units arranged in an array of columns and banks, wherein each of said memory units includes, at least one memory cell, and a bit line coupled to said at least one memory cell, wherein said bit line receives a bit of information from said at least one memory cell;
    a plurality of global column selection lines each of which extends along a respective column of said memory units through each of said banks;
    a column decoder which generates global column selection signals on said plurality of global column selection lines;
    a plurality of input/output lines each of which extends along a respective bank of said memory units; and
    a plurality of memory unit selection circuits, each of which connects a respective bit line of a respective memory unit to a respective input/output line responsive to a respective global column selection signal on said respective global column selection line and a bank select column address signal so that only one bit line from said plurality of memory units is connected to a respective one of said input/output lines at a time;
    wherein each of said memory selection circuits further comprises a column selection transistor which connects said respective bit line to said respective input/output line responsive to the respective global column selection signal and the bank select column address signal and wherein each of said memory selection circuits further comprises,
        a first bank selection transistor which electrically connects a gate of said column selection transistor to said respective global column selection line responsive to the bank select column address signal and
        a second bank selection transistor which electrically connects said gate of said column selection transistor to a predetermined disable signal responsive to a logical inverse of said bank select column address signal.

2. An integrated circuit memory device according to claim 1 wherein each of said memory units further includes a complementary bit line coupled to said memory cell which receives a complementary bit of information from said memory cell, said integrated circuit memory device further comprising a plurality of complementary input/output lines, each of which extends along a respective bank of said memory units, and wherein said respective memory selection circuit connects said respective complementary bit line to said respective complementary input/output line responsive to the global column selection signal and the bank select column address signal.

3. A method for selecting a memory unit of an integrated circuit memory device including a plurality of memory units arranged in an array of columns and banks, and a plurality of input/output lines wherein each of said input/output lines extends along a respective bank of said memory units, wherein each of said memory units includes at least one memory cell, a bit line coupled to said at least one memory cell, and a column selection transistor connected between the bit line and the respective input/output line, said method comprising the steps of:
    generating a global column selection signal for each column of said memory units;
    generating a bank select column address signal for each bank of said memory units; and
    connecting a bit line of a respective memory unit to the respective input/output line through said column selection transistor responsive to a respective global column selection signal and a respective bank select column address signal so that only one bit line from said plurality of memory units is connected to a respective one of said input/output lines at a time;
    wherein said connecting step further comprises the steps of,
        connecting a gate of said column selection transistor to said respective column selection signal responsive to the bank select signal; and
        connecting said gate of said column selection transistor to a predetermined disable signal responsive to a logical inverse of said bank select column address signal.

4. An integrated circuit memory device comprising:
    a plurality of memory units arranged in an array of columns and banks, wherein each of said memory units includes, at least one memory cell, and a bit line coupled to said at least one memory cell, wherein said bit line receives a bit of information from said at least one memory cell;

a plurality of global column selection lines each of which extends along a respective column of said memory units through each of said banks;

a column decoder which generates global column selection signals on said plurality of global column selection lines;

a plurality of input/output lines each of which extends along a respective bank of said memory units;

a plurality of column selection circuits each of which generates a local column selection signal for a respective bit line of a respective memory unit responsive to a bank select column address signal and the global column selection signal on said global column selection line adjacent said respective memory unit; and a plurality of column selection transistors each of which connects said respective bit line to a respective input/output line responsive to the local column selection signal;

wherein each of said column selection circuits comprises:

a first transistor which electrically connects a gate of said column selection transistor to said respective global column selection line responsive to the bank select column address signal; and a second transistor which electrically connects said gate of said column selection transistor to a predetermined disable signal responsive to a logical inverse of said bank select column address signal.

5. An integrated circuit memory device according to claim 4 wherein each of said memory units further includes a complementary bit line coupled to said at least one memory cell which receives a complementary bit of information from said at least one memory cell, said integrated circuit memory device further comprising:

a plurality of complementary input/output lines each of which extends along a respective bank of said memory units; and a plurality of complementary column selection transistors each of which connects said respective complementary bit line of said respective memory unit to said respective complementary input/output line responsive to the local column selection signal.

6. A semiconductor memory device comprising:

a plurality of memory cells arranged in an array of columns and banks;

a plurality of bit line pairs wherein each of said pairs of bit lines is coupled to a respective memory cell;

a plurality of column select transistor pairs each of which is connected to a respective pair of bit lines, each of said column select transistors including an input gate and first and second input/output electrodes and each of said first input/output electrodes being connected to a respective bit line;

a plurality of global column select lines each of which extends along a respective column of said memory cells through each of said banks;

a column decoder for providing global column select signals along said plurality of global column select lines;

a plurality of local column select lines each of which is connected to respective input gates of a respective column select transistor pair; and a plurality of connecting means for connecting each of said global column select lines with respective local column select lines in response to a bank selection signal;

wherein each of said connecting means respectively includes a first MOS transistor with first and second input/output electrodes respectively connected to a respective global column select line and a respective local column select line and with a gate input for receiving said bank selection signal and a second MOS transistor with first and second input/output electrodes respectively connected to a predetermined disable signal and said respective local column select line and with a gate input for receiving a logical inverse of said bank selection signal.

7. A semiconductor memory device according to claim 6 wherein said bank selection signal is a column address signal.

8. A semiconductor memory device according to claim 6 wherein said bank selection signal is a column address signal.

* * * * *

UNITED STATES PATENT AND TRADEMARK OFFICE
CERTIFICATE OF CORRECTION

PATENT NO.    :   5,715,209

DATED         :   February 3, 1998

INVENTOR(S)   :   Jei-Hwan Yoo

It is certified that error appears in the above-identified patent and that said Letters Patent is hereby corrected as shown below:

| | |
|---|---|
| Column 1, Line 33 | Change "CSL0" to -- CSLØ --. |
| Column 1, Line 51 | Change "SIOOB" to --SIOØB --. |
| Column 3, Line 43 | Change "stature" to -- structure --. |
| Column 4, Line 39 | Change "SI00B" to -- SIOØB --. |
| Column 4, Line 47 | Change "BCAOB" to -- BCAØB --. |
| Column 4, Line 48 | Change "BCAOB" to -- BCAØB --. |
| Column 4, Line 58 | Change "BCAOB" to -- BCAØB --. |
| Column 4, Line 60 | Change "CSTI" to -- CST1 --. |
| Column 4, Line 61 | Change "SI00 and SI00B" to -- SIOØ and SIOØB --. |
| Column 5, Line 10 | Change "LCSLlI" to -- LCSL11 --. |
| Column 5, Line 11 | Change LCSLnI" to -- LCSLn1 --. |
| Column 5, Line 16 | Change "BCAOB" to -- BCAØB --. |
| Column 5, Line 21 | Change "SIOOB" to -- SIOØB --. |
| Column 6, Line 9  | Change "signal" to -- signal, --. |
| Column 6, Line 15 | Change "signal" to -- signal; --. |

Signed and Sealed this

Ninth Day of February, 1999

Attest:

Attesting Officer

Acting Commissioner of Patents and Trademarks